United States Patent
Lansford

(10) Patent No.: US 6,485,990 B1
(45) Date of Patent: Nov. 26, 2002

(54) FEED-FORWARD CONTROL OF AN ETCH PROCESSING TOOL

(75) Inventor: Jeremy Lansford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/476,875

(22) Filed: Jan. 4, 2000

(51) Int. Cl.$^7$ ............... H01L 21/00; H01L 21/306; G06F 19/00
(52) U.S. Cl. ............... 438/5; 156/345.24; 700/121; 438/8
(58) Field of Search ............... 438/5, 7, 8, 9, 438/10, 16; 156/345, 345.1, 345.24; 216/59, 60, 61, 84, 85, 86; 700/121

(56) References Cited

U.S. PATENT DOCUMENTS

| | | | | |
|---|---|---|---|---|
| 4,528,438 A | * | 7/1985 | Poulsen et al. | 219/121 PE |
| 5,308,447 A | * | 5/1994 | Lewis et al. | 156/626 |
| 5,405,488 A | | 4/1995 | Dimitrelis et al. | |
| 5,565,114 A | | 10/1996 | Saito et al. | |
| 5,788,869 A | | 8/1998 | Dalton et al. | |
| 5,871,658 A | | 2/1999 | Tao et al. | |
| 6,197,116 B1 | * | 3/2001 | Kosugi | 118/712 |

FOREIGN PATENT DOCUMENTS

| | | |
|---|---|---|
| EP | 0 631 304 A2 | 5/1994 |
| JP | 56-125841 | 10/1981 |
| JP | 2-310921 | 12/1990 |

OTHER PUBLICATIONS

John Baliga, Associate Editor, "Advanced Process Control: Soon to be a Must", Jul. 1999, Semiconductor International, 8 page cover story with sub–story entitled "The APC Framework and Process Technology Transfer" to Alan Weber appearing on the 5$^{th}$ page.*

Voshchenkov et al., "Smarter Tools by Design", 1997, Extended Abstract of Presentation at the 1997 AVEM Fall Seminar, 4 pages total.*

Edgar et al., "Automatic Control in Microelectronics Manufacturing Practices, Challenges, and Possibilities", dated May 1, 1998 with publication confirmed in Automatica in Nov. 2000, 98 pages total.*

\* cited by examiner

Primary Examiner—Michael Sherry
Assistant Examiner—Evan Pert
(74) Attorney, Agent, or Firm—Williams, Morgan & Amerson

(57) ABSTRACT

A method includes measuring a surface non-uniformity of a wafer. A current state of an etch processing tool is determined. The surface non-uniformity of the wafer is compared with the current state of the processing tool. An operating parameter of the processing tool is adjusted based on the comparison of the surface non-uniformity of the wafer with the current state of the processing tool. A system includes a processing tool, a plurality of measuring devices, and a process controller. The processing tool is adapted for etch processing of a wafer. The plurality of measuring devices measure a surface non-uniformity of the wafer and determine a current state of the processing tool. The process controller compares the surface non-uniformity of the wafer with the current state of the processing tool and adjusts an operating parameter of the processing tool based on the comparison.

34 Claims, 6 Drawing Sheets

FEED-FORWARD CONTROL OF AN ETCH PROCESSING TOOL

BACKGROUND OF THE INVENTION

1. Field of the Invention

This invention relates generally to semiconductor processing, and more particularly, to a method for feed-forward control of an etch processing tool.

2. Description of the Related Art

The technology explosion in the manufacturing industry has resulted in many new and innovative manufacturing processes. Today's manufacturing processes, particularly semiconductor manufacturing processes, call for a large number of steps that must be accurately executed to produce useful semiconductor devices. To maintain proper manufacturing control, a number of inputs are generally used to fine-tune the steps.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are significantly different from one another and specialized to the point that the processes may be readily performed in different manufacturing locations that contain different control schemes.

Among the factors that affect semiconductor device manufacturing are wafer-to-wafer variations, start-up effects of manufacturing machine tools, and memory effects of manufacturing chambers. One of the process steps adversely affected by such factors is etch processing of semiconductor wafers.

Those skilled in the art will appreciate that etch processing may be used in conjunction with other semiconductor processing techniques, such as photolithography, deposition, and the like, to produce various circuit geometries on a surface of a wafer. Generally, etch processing comprises exposing at least a portion of the wafer to an etchant material. For example, features may be defined on a surface of the wafer through the use of a selectively patterned protective coating, such as photoresist, and by performing one or more etching processes. The protective coating is patterned to expose portions of the surface of the wafer to the etchant material. The exposed portions are removed during the etching process to produce the desired circuit geometries on the surface of the wafer.

Referring to FIG. 1, a cross-sectional view of a wafer 10 shown. In this illustrative embodiment, the wafer 10 comprised of a substrate 12, a stop layer 14, and an etch layer 16. Those skilled in the art will appreciate that, as a result of any number of processing variables, the etch layer 16 of the wafer 10 may become non-uniform, (e.g., its thickness may vary across the layer, its surface may be uneven or wavy, etc.) Although any number of surface topographies may manifest in the wafer 10 during processing, the wafer 10 generally exhibits center-to-edge non-uniformity after a chemical mechanical polishing operation is performed on the surface 17 of the etch layer 16. For example, as shown in FIG. 1, the thickness of the etch layer 16 may gradually increase from the center to the outer edge of the wafer 10, which is typically referred to as center-thin non-uniformity. Because of the center-thin non-uniformity of the etch layer 16, during an etching process, the portion of the etch layer 16 located at the center of the wafer 10 may be removed sooner than the portion of the etch layer 16 located at the outer edge of the wafer 10.

In FIG. 2, a trench 18 may be formed by selectively exposing the wafer 10 to a timed etching process. Those skilled in the art will appreciate that the duration of the etching process may vary depending upon, among other things, the thickness of the etch layer 16. Generally, the duration of the etching process is an engineering design decision based on approximations that may not adequately account for the non-uniformity of the etch layer 16 and other processing variables, such as wafer coverage of the etch layer 16, the non-uniformity of the etching process, and the like. In this embodiment, because of the center-thin non-uniformity of the etch layer 16, a portion of the stop layer 14 may be removed during the etching process. The degree to which the etching process is continued after the etch layer 16 is completely removed is called overetch. The amount of overetch is illustrated by the distance "x."

Referring to FIG. 3, another cross-sectional view of a wafer 20 is shown. The wafer 20 may be comprised of a substrate 12, a stop layer 14, and an etch layer 16. Again, although a variety of surface topographies may manifest in the wafer 20 during manufacturing, the wafer generally exhibits center-to-edge non-uniformity. In this illustrative embodiment, the thickness of the etch layer 16 may gradually decrease from the center to the outer edge of the wafer 20, which is typically referred to as center-thick non-uniformity. Because of the center-thick non-uniformity of the etch layer 16, during an etching process, the portion of the etch layer 16 located at the edge of the wafer 20 may be removed sooner than the portion of the etch layer 16 located at the center of the wafer 20.

In FIG. 4, a trench 18 may be formed by selectively exposing the wafer 20 to a timed etching process. Again, the duration of the etching process may be an engineering design decision based on approximations. In this embodiment, because of the center-thick non-uniformity of the etch layer 16, a portion of the etch layer 16 may not be removed from the trench 18. The degree to which the etch layer 16 is not completely removed is called incomplete etch. The amount of incomplete etch is illustrated by the distance "y."

Unfortunately, because of the possible non-uniformity and other processing variables, determining duration times for various etching processes is extremely difficult. For example, the duration of the etching process must adequately account for the non-uniformity of the wafer and other processing variables. One such processing variable includes etch rate non-uniformity of an etch processing tool. For example, during an etching process, the etch rate across the surface of a wafer may be non-uniform. In one embodiment, because of the surface non-uniformity of a wafer (e.g., center-thin, center-thick, etc.), the non-uniformity of the etching process may result in extreme overetch or incomplete etch of the wafer. For example, if the surface topography of a wafer is center-thin and the etch rate is center-fast, the center of the wafer may be severely overetched.

In one embodiment, with center-thin surface non-uniformity of a wafer, a degree of overetch at the center of the wafer may be required to ensure that the outer edge of the wafer is sufficiently etched. Alternatively, with center-thick surface non-uniformity of a wafer, a degree of overetch at the outer edge of the wafer may be required to ensure the center of the wafer is sufficiently etched.

Generally, when processing a wafer it is desirable to minimize overetch and incomplete etch. For example, it may be undesirable to overetch unnecessarily because the underlying layer is typically thinned during overetch, which may result in a decreased production yield. In addition, incomplete etch of wafers may also result in a decreased production yield.

The present invention is directed to overcoming, or at least reducing the effects of, one or more of the problems set forth above.

SUMMARY OF THE INVENTION

In one aspect of the present invention, a method is provided. The method includes measuring a surface non-uniformity of a wafer. A current state of an etch processing tool is determined. The surface non-uniformity of the wafer is compared with the current state of the processing tool. An operating parameter of the processing tool is adjusted based on the comparison of the surface non-uniformity of the wafer with the current state of the processing tool.

In another aspect of the present invention, a system is provided. The system includes a processing tool, a plurality of measuring devices, and a process controller. The processing tool is adapted for etch processing of a wafer. The plurality of measuring devices measure a surface non-uniformity of the wafer and determine a current state of the processing tool. The process controller compares the surface non-uniformity of the wafer with the current state of the processing tool and adjusts an operating parameter of the processing tool based on the comparison.

BRIEF DESCRIPTION OF THE DRAWINGS

The invention may be best understood by reference to the following description taken in conjunction with the accompanying drawings, in which like reference numerals identify like elements, and in which.

Figure 1:
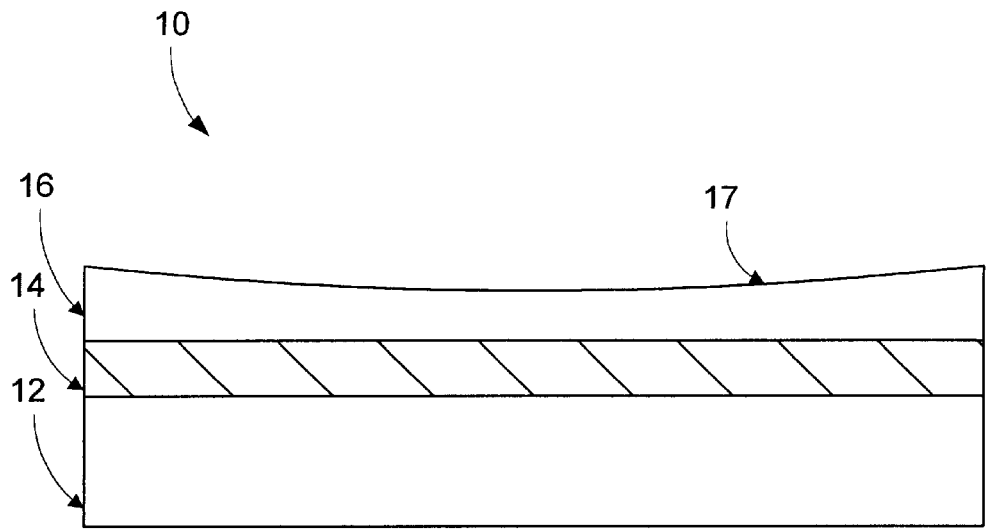
FIG. 1 is a cross-sectional view of a semiconductor wafer.
Figure 2:
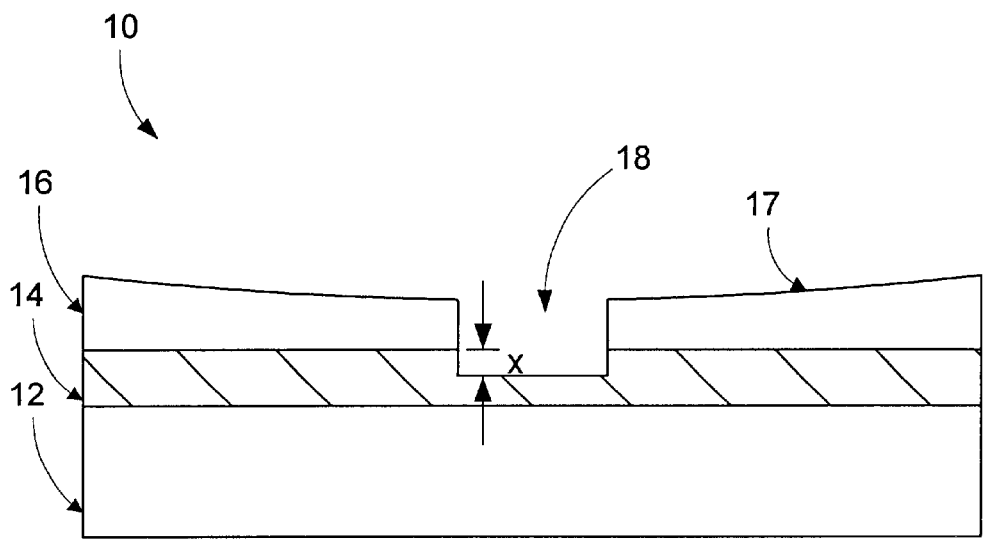
FIG. 2 is a cross-sectional view of the semiconductor wafer of FIG. 1 having a trench disposed therein.
Figure 3:
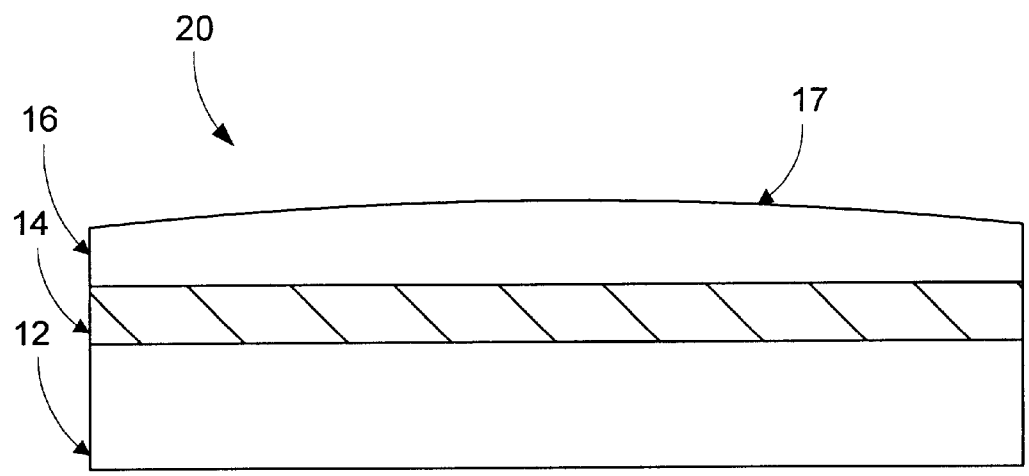
FIG. 3 is a cross-sectional view of a semiconductor wafer.
Figure 4:
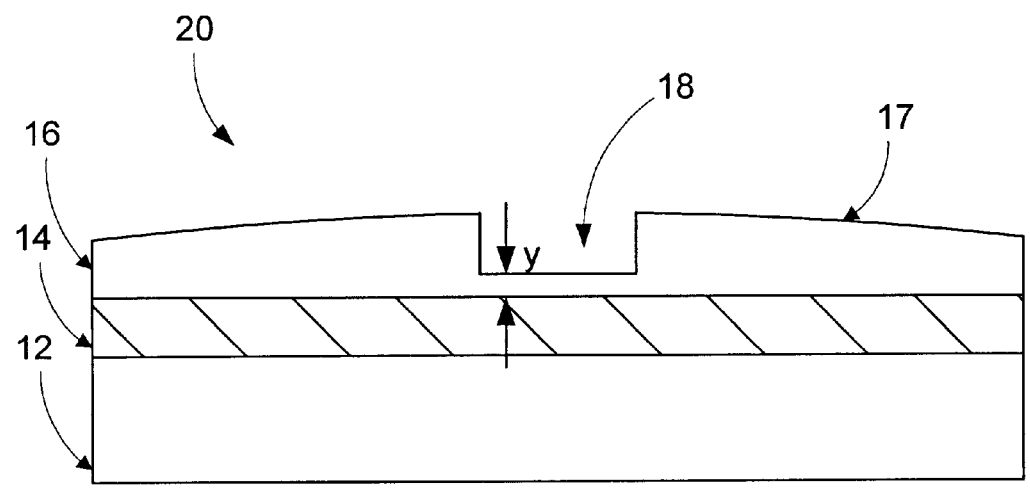
FIG. 4 is a cross-sectional view of the semiconductor wafer of FIG. 3 having a trench disposed therein.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 5:
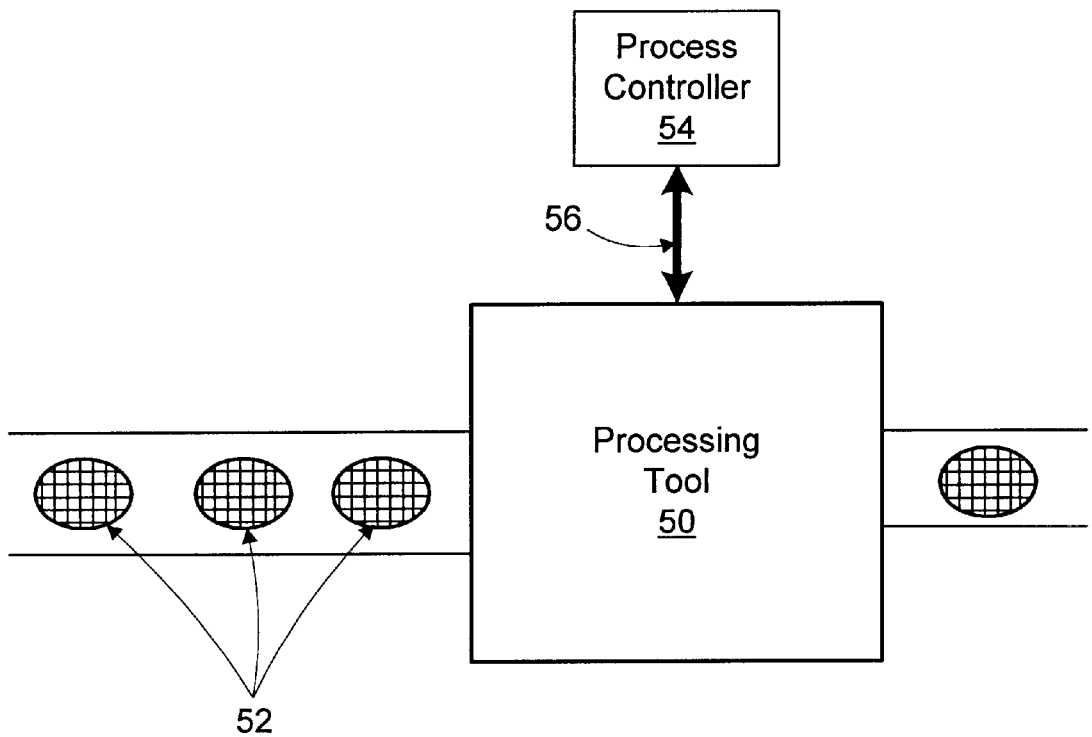
FIG. 5 is a simplified block diagram of a processing tool used to manufacture semiconductor devices.

Referring to FIG. 5, an exemplary processing tool 50 is shown. The processing tool 50 may be used as one part of an elaborate fabrication process to manufacture semiconductor wafers 52 into functional semiconductor devices. The processing tool 50 may be controlled by a process controller 54 that may send a plurality of control signals to the processing tool 50 on a control line 56. The process controller 54 may be comprised of a variety of devices. For example, in one embodiment, the process controller 54 may be a controller embedded inside the processing tool 50 to communicate with the processing tool 50 using protocols and interfaces provided by the manufacturer. Alternatively, in another embodiment, the process controller 50 may be connected to a larger network of controllers to communicate with the processing tool 50 through an Advanced Process Control (APC) framework interface. For example, the processing tool 50 may be coupled to an equipment interface (not shown) that retrieves various operational data from the processing tool and communicates this data to the Advanced Process Control (APC) framework to determine whether the processing tool 50 is experiencing a faulty operation. The equipment interface may also receive control signals from the APC framework that may be used to control the processing tool 50. For example, the control signals from the APC framework may be used to adjust various operational parameters of the processing tool 50 based on processing data received by the APC framework. The processing data may be generated by any number of sources, such as the processing tool 50, data bases, user input, other processing tools also connected to the APC framework, and the like.

The semiconductor wafers 52 are generally processed in batches, which are commonly referred to as lots or batch processing. For example, a lot of wafers 52 may be comprised of twenty five wafers 52. The wafers 52 within a lot typically progress through the manufacturing process together in an attempt to subject the wafers 52 to substantially the same manufacturing conditions, such that the resulting semiconductor devices have substantially the same performance characteristics (e.g., speed, power, etc.) Generally, when the processing tool 50 permits, a lot of wafers 52 are processed simultaneously, and the wafers 52 within the lot are subjected to substantially the same manufacturing conditions. However, a variety of processing tools 50, such as an etch processing tool, may process the wafers 52 individually. For example, rather than simultaneously processing all the wafers 52 in a lot, each wafer 52 is successively and individually processed.

Figure 6:
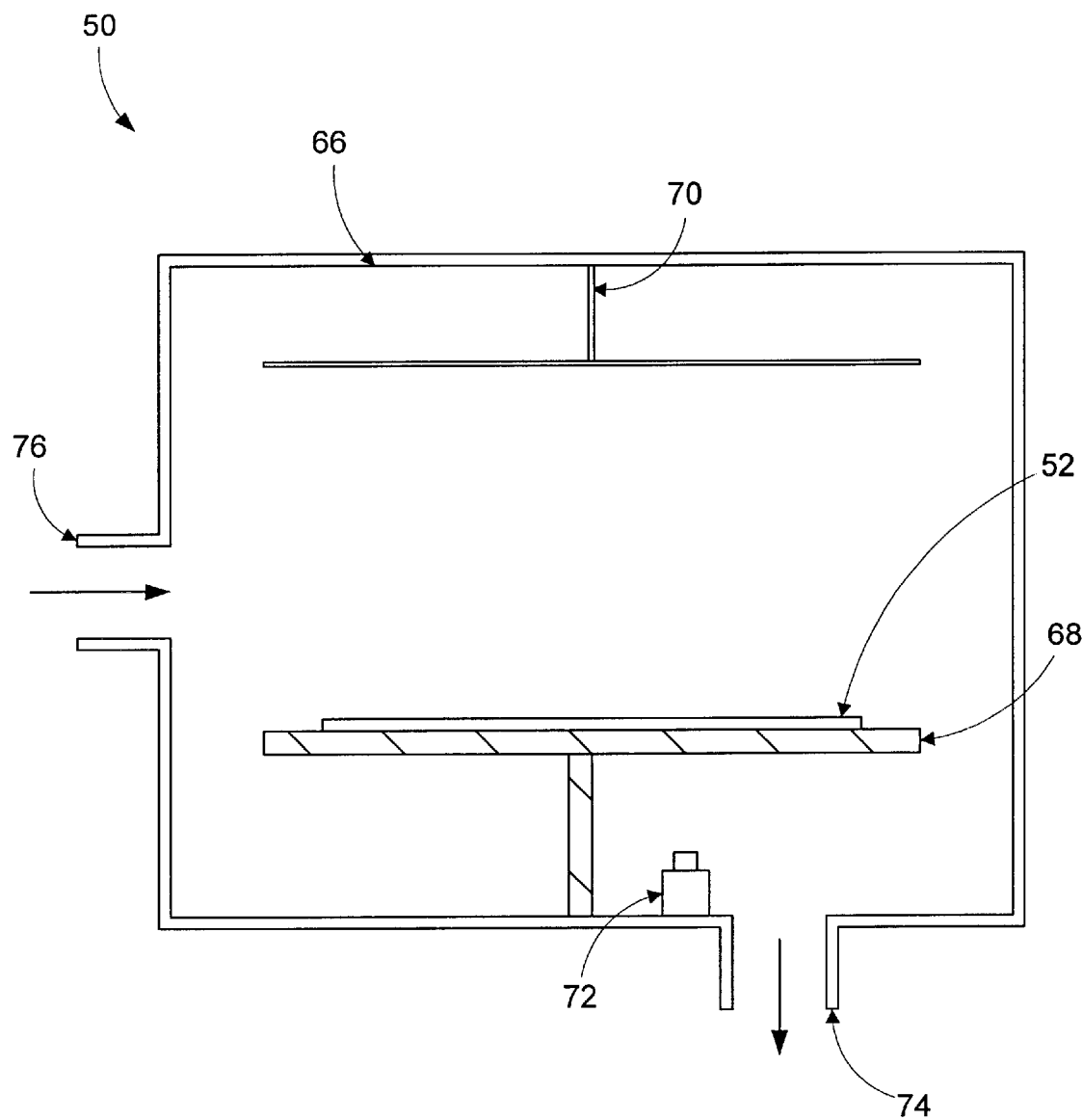
FIG. 6 is a cross-sectional view of an illustrative embodiment of an etch processing tool.

Referring to FIG. 6, a cross-sectional view of an illustrative processing tool 50 is shown. In this illustrative embodiment, the processing tool 50 is a planar plasma etcher that may be used for etching various processing layers formed on the semiconductor wafer 52. For example, referring to FIG. 6, an exemplary cross-sectional view of the wafer 52 is shown. Those skilled in the art will appreciate that the wafer 52 may be comprised of a substrate 58 and any number of processing layers 60 that may vary depending upon the particular process. In this illustrative embodiment, the processing layers 60 are comprised of a stop layer 62 and an etch layer 64. The stop layer 62 and the etch layer 64 may be comprised of a variety of materials, such as polysilicon, silicon nitride, silicon dioxide, metal, and the like. Although not shown, the surface 51 of the wafer 52 (e.g., the surface 65 of the etch layer 64 in this example) may be non-uniform. For example, the wafer 52 may exhibit center-to-edge variations, such as center-thin non-uniformity, center-thick non-uniformity, and the like. Furthermore, as will be described below, the operating parameters of the processing tool 50 may be adjusted to account for the surface non-uniformity of the wafer 52 and other processing variables.

Referring back to FIG. 6, although the processing tool 50 is depicted as a planar plasma etcher for illustrating the present invention, the processing tool 50 may be comprised of a variety of etching devices, such as a single wafer etching chamber or chambers, barrel plasma etcher, hexode plasma etcher, ion milling etcher, wet etcher, and the like. Moreover, details of the processing tool 50 are simplified to avoid unnecessarily obscuring the invention. In the illustrative embodiment, the processing tool 50 is comprised of a reaction chamber 66, a pallet 68, an electrode 70, and an endpoint detector 72.

The reaction chamber 66 may include a vacuum system opening 74 and a gas supply opening 76. The vacuum system opening 74 may be connected to a vacuum pump (not shown), which may be used to create a vacuum environment inside the reaction chamber 66. The gas supply opening 76 may be connected to a gas supply (not shown), which may be used to channel one or more chemical etchant materials (e.g., a reactive gas) into the reaction chamber 66. Typically, the wafer 52 is loaded into the reaction chamber 66 of the processing tool 50 and placed on the pallet 68. Once the reaction chamber 66 is sealed, a vacuum environment is created, and the reaction chamber 66 is filled with a reactive gas (e.g., $CF_4$). The electrode 70 may be energized from a power supply (not shown), and a radio frequency (RF) field may be established inside the reaction chamber 66. The RF field energizes the reactive gas mixture into a plasma state. Once energized, the plasma may etch the exposed portion of the wafer 52, and the duration of the etching process may be varied as a matter of design choice. As will be described below, the process controller 54 may adjust various operating parameters of the processing tool 50 to account for the surface non-uniformity of the wafer 52 and other processing variables.

In this embodiment, the pallet 68 is electrically grounded and the RF field is established between the electrode 70 and the pallet 68. With this arrangement, the wafer 52 is placed in the plasma field. Moreover, to ensure a more uniform etch rate across the surface of the wafer 52, the pallet 68 may be rotated during the etching process.

The endpoint detector 72 may be used to monitor the status of the etching process. For example, in one embodiment, the endpoint detector 72 uses optical emission spectroscopy (OES) to measure passively the concentration levels of the contents of the plasma. While measuring the concentration levels, the endpoint detector 72 may generate a corresponding concentration signal, which may be sent to the process controller 54.

Those skilled in the art will appreciate that when the wafer 52 is being etched, the exposed portions of the etch layer 64 are being removed and an etch layer reaction product may be mixed with the plasma. For example, when etching silicon dioxide ($SiO_2$) with the reactive gas carbon hexafluoride ($C_2F_6$), the etch layer reaction product may be silicon tetrafluoride ($SiF_4$). Once the etch layer 64 of the wafer 52 is almost completely removed, the supply of the etch layer 64 to the etching process is reduced, and the concentration level of the etch layer reaction product (e.g., $SiF_4$) is decreased. The endpoint detector 72 may monitor the decrease in etch layer reaction product, and once the concentration level has decreased beyond a threshold value, the process controller 54 may determine that the etch layer 64 is sufficiently etched. In a similar manner, the endpoint detector 72 may monitor whether a stop layer reaction product is included in the plasma. For example, once the etch layer 64 is completely removed and the stop layer 62 is exposed, the plasma may begin to etch away the exposed portions of the stop layer 62. When this occurs, a stop layer reaction product may be introduced into the plasma. In this embodiment, the endpoint detector 72 may monitor for an increase in the stop layer reaction product, and once the concentration level has increased beyond a threshold value, the process controller 54 may determine that the etch layer 64 is sufficiently etched.

With a typical etching process using endpoint control, the overall etching process may be considered as particularized processes. For example, in one illustrative embodiment, the etching process may be comprised of a main etch, an endpoint etch, and an over etch. With this example, during the main etch, the wafers 52 may be etched without monitoring the concentration level of the contents of the plasma, and a good portion of the exposed etch layer 64 may be removed. Although the duration of the main etch may vary depending upon the particular process, in one example, the main etch may last 30 seconds.

Once the main etch is complete, the endpoint etch may begin, and as described above, the endpoint detector 72 may monitor the concentration level of the contents of the plasma, and the process controller 54 may determine when the endpoint etch is complete. Again, the endpoint detector 72 may measure the concentration level of the etch layer reaction product, the stop layer reaction product, or other relevant elements of the plasma. Typically, during one part of the endpoint etch, the process controller 54 determines a baseline concentration level of the relevant reaction product. From the baseline concentration level, the process controller 54 may observe increases or decreases in the concentration level of the reaction product and determine when the endpoint etch is complete. In one embodiment, the endpoint etch may last between 10 and 25 seconds. Of course, those skilled in the art will appreciate that a variety of control algorithms may be used in combination with the endpoint detector 72 and the process controller 54 to determine when the endpoint etch is complete.

Once the process controller 54 has determined that endpoint etch is complete, the over etch may begin, which ensures that the wafers 52 are sufficiently etched. The over etch time for the etching process may be varied as a matter of design choice, and in one embodiment, the over etch time is seven seconds. Those skilled in the art will appreciate that the particularized processes described above (e.g., main etch, endpoint etch, and over etch) are part of a continual etching processes, and the particularized processes may be considered individually to simplify control of the overall etching process. Furthermore, if desired, the etching process may be further subdivided into additional process, or the etching process may be considered and controlled as a whole.

Figure 7:
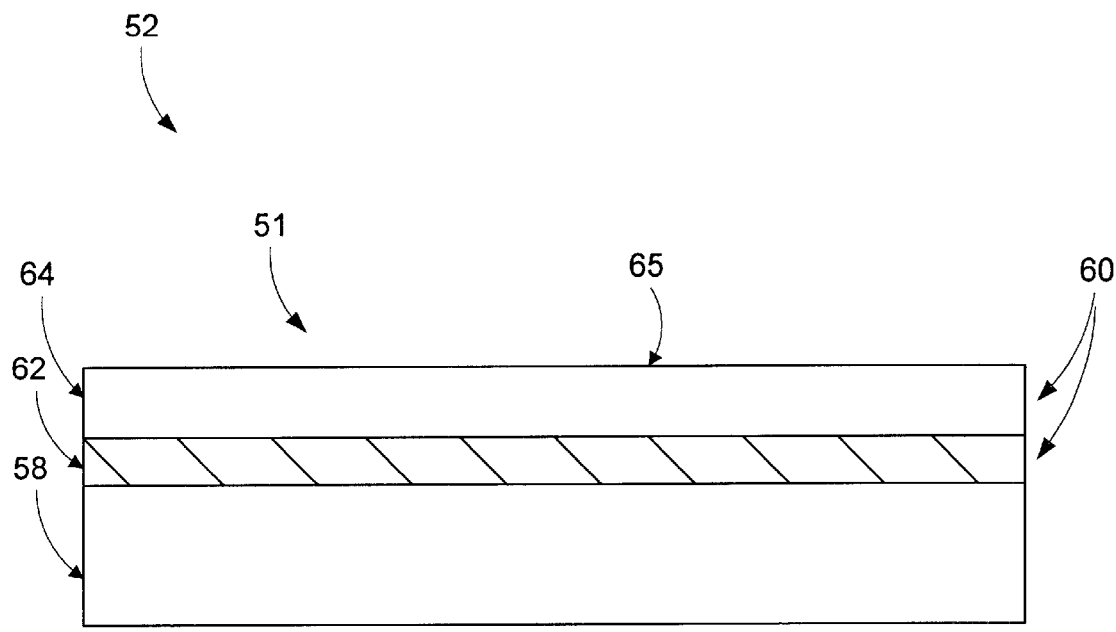
FIG. 7 is a cross-sectional view of a semiconductor wafer.
Figure 8:
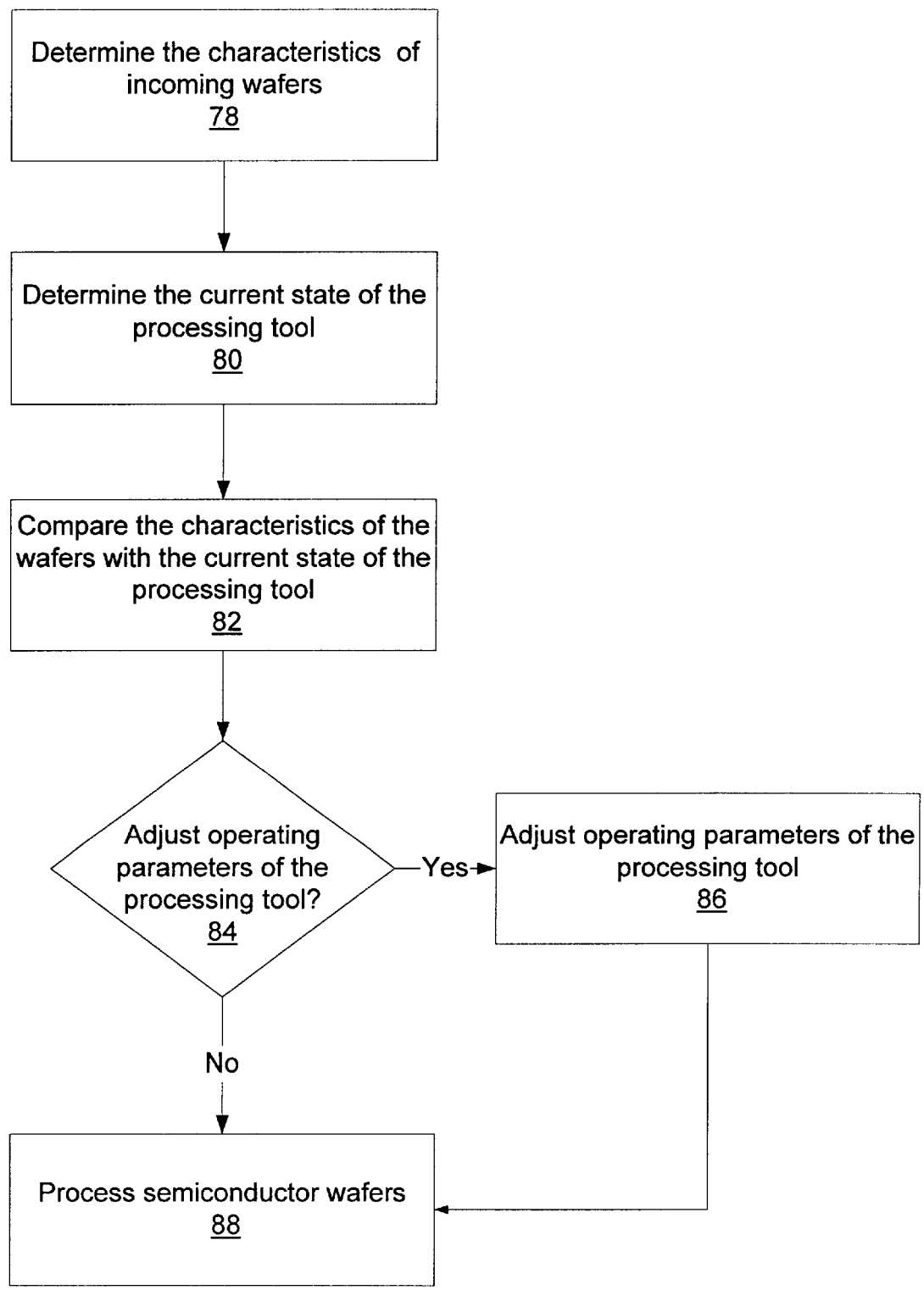
FIG. 8 illustrates a flowchart representation of the methods taught by the present invention.

Referring to FIG. 8, a flowchart depiction of one illustrative embodiment of the present invention is illustrated. At block 78, the characteristics of the wafers 52 to be processed are determined. As described above, the surface 51 of the wafer 52, illustrated in FIG. 7, may exhibit any number of surface topographies, such as center-thin non-uniformity, center-thick non-uniformity, etc. Those skilled in the art will appreciate that the surface topography of the wafer 52 may be determined using a variety of known techniques. For example, in one embodiment, with transparent processing layers 60 (e.g., oxide, polysilicon, silicon nitride, etc.), the surface non-uniformity of the wafer 52 may be determined using ellipsometry or laser interferometry. With non-transparent processing layers 60, such as metal, other measuring techniques may be used. For example, a four-point-probe may be used to measure the sheet resistance of the processing layer 60, and from this data, the thickness of the processing layer 60 may be determined at various locations across the wafer.

In one embodiment, monitor wafers (not shown) may be included in a lot of production wafers 52. The monitor wafers may progress through the manufacturing process with the lot of production wafers 52 experiencing substantially the same manufacturing conditions. Rather than handling the production wafers 52, the measurement methods described above may be performed on the monitor wafers, and these measurements may be used as representative samples of the production wafers 52. In another embodiment, various cross-sections of the monitor wafers 52 may be measured using, for example, a scanning electron microscope to determine the non-uniformity of the etch layer 64 of the production wafers 52. Once determined, the non-uniformity data of the wafers 52 may be sent to the process controller.

In addition to non-uniformity, the process controller 54 may consider a variety of other processing characteristics of the wafers 52 during control of the processing tool 50. For example, as described above, the etch layer 64 of the wafer 52 may be only partially exposed to the etching process. Those skilled in the art will appreciate that a mask layer (not shown) may be selectively patterned on the surface of the wafer 52, and only a portion of the etch layer 64 may be exposed to and removed during the etching process. The percentage of the etch layer 64 effectively exposed to the etching process (i.e., effective exposure) may affect the optimal operating parameters of the processing tool 50. For example, if a wafer 52 with an 80 percent effective exposure to the etching process takes 60 seconds to etch, a wafer with 50 percent effective exposure may take only 50 seconds to etch depending upon the particular process. Alternatively, with other processes, a decrease in effective exposure may increase the optimal etching time. Furthermore, other product-to-product differences may be considered by the process controller 54, such as the material being etched, wafer size, processing technology, and the like.

At block 80, the current state of the processing tool 50 may be determined. In one embodiment, the etch rate of the processing tool 50 may not be completely uniform across the surface of the wafers 52. For example, if the pre-process surface characteristics of the wafer 52 is substantially uniform, in one embodiment, the subsequent post-process surface characteristics of the wafer 52 may be center-thin, center-thick, etc. In addition, the processing profile (e.g., center-fast, center-slow, etc.) of the processing tool 50 may be unpredictable and change between processing runs.

A variety of methods may be used to determine the current state of the processing tool 50 (e.g., center-slow, center-fast, etc.) In one embodiment, the processing tool 50 may process monitor wafers (not shown) having known pre-process characteristics. Once processed, the post-process character-istics of the monitor wafers may be measured, and from this data, the current state of the processing tool 50 may be determined. In another embodiment, the pre-process characteristics of production wafers may be compared with their post-process characteristics to determine the current state of the processing tool 50. In addition to processing profile described above, other variables may be monitored to determine the current state of the processing tool 50, such as temperature, average etch rate, pressure, reactive gas concentration, and the like. Furthermore, those skilled in the art will appreciate that a variety of processing variables may be monitored using a variety of measuring algorithms, and the method selected may vary depending upon the particular process and processing tool 50.

At block 82, the process controller 54 may compare the characteristics of the wafers 52 with the current state of the processing tool 50. For example, in one embodiment, the process controller 54 may compare the processing profile of the processing tool 50 with the surface non-uniformity of the wafers 52. Depending upon the results of the comparison, adjustments may be made to the operating parameters of the processing tool 50.

Those skilled in the art will appreciate that overetching the wafers 52 may thin the underlying stop layer 62, which may result in a decrease in production yield. However, if the non-uniformity of the wafer 52 is great, when etching the wafer 52, the stop layer 62 may be reached sooner for a portion of the wafer 52 while other portions of the wafer 52 are still partially covered with the etch layer 64. When this occurs, using the endpoint control scheme described above without adjusting the process for the non-uniformity and other processing characteristics of the wafers 52 may result in portions of the etch layer 64 being improperly etched (e.g., overetch, incomplete etch, etc.) Alternatively, if the processing profile of the processing tool 50 is the opposite of the surface non-uniformity of the wafers 52, no significant adjustment to the operating parameters of the processing tool 50 may be required. For example, if the processing profile is center-fast and the surface non-uniformity of the wafers 52 is center-thick, because the differences may sufficiently compensate for each other, the etch layer 64 may be etched without adjusting the operating parameters of the processing tool 50. Alternatively, if the processing profile and the surface non-uniformity of the wafers 52 are similar, more significant adjustments to the operating parameters of the processing tool 50 may be required. For example, without adjusting the processing tool 50, endpoint may be determined prematurely and portions of the wafer 52 may be improperly etched.

At block 84, the process controller 54 may decide whether to adjust the operating parameters of the processing tool 50 based on the comparison of the characteristics of the wafers 52 and the current state of the processing tool 50. If it is determined that the current state of the processing tool 50 is inadequate to sufficiently etch the wafers 52, at block 86, the appropriate operating parameters of the processing tool 50 may be adjusted.

The process controller 54 may manipulate the etching process by adjusting a variety of different operating parameters of the processing tool 50. In one embodiment, the process controller 54 may adjust the endpoint etch of the etching process. For example, the process controller 54 may adjust the endpoint etch time by adjusting the threshold concentration level that determines when the endpoint etch is complete. When monitoring the etch layer reaction product, the etching process may be extended by decreasing the endpoint threshold concentration level. Alternatively, increasing the endpoint threshold concentration level may shorten the etching process. Likewise, when monitoring the stop layer reaction product, the etching process may be extended by increasing the endpoint threshold concentration level. Alternatively, with the stop layer reaction product, decreasing the endpoint threshold concentration level may shorten the etching process. Generally, when the non-uniformity of the wafer 52 is significant, the duration of the etching process may be increased to ensure the entire wafer 52 is sufficiently etched. However, as illustrated above, the processing profile of the processing tool 50 may affect the necessary adjustments to the operating parameters of the processing tool 50.

In addition to manipulating the endpoint etch of the etching process, the over etch time of the processing tool 50 may also be adjusted by the process controller 54. Similarly, if the non-uniformity of the wafer 52 is significant, the duration of the over etch may be increased to ensure the entire wafer 52 is sufficiently etched. Alternatively, if the processing profile of the processing tool 50 and the non-uniformity of the wafer compensate 52 for each other, the duration of the over etch may be decreased or remain unchanged.

Other operating parameters of the processing tool 50 may be adjusted without affecting the duration of the etching process. For example, the etch rate of the processing tool 50 may be increased by changing the pressure inside the reaction chamber 66, increasing the power to the electrode 70, increasing the flow of the reaction gas, and the like. Again, if the non-uniformity of the wafer 52 is significant, the etch rate of the processing tool 50 may be increased to ensure the entire wafer 52 is sufficiently etched. Similarly, if the processing profile of the processing tool 50 and the non-uniformity of the wafer 52 compensate for each other, the etch rate of the processing tool 50 may be decreased or remain unchanged. Alternatively, if no adjustments are necessary to the operating parameters of the processing tool 50, at block 88, the wafers 52 may be processed using the current state of the processing tool 50.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   measuring a surface non-uniformity of a wafer;
   determining a current state of an etch processing tool;
   comparing the surface non-uniformity of the wafer with the current state of the processing tool; and
   adjusting an operating parameter of the processing tool based on the comparison of the surface non-uniformity of the wafer with the current state of the processing tool.

2. The method of claim 1, further comprising:
   determining at least one processing characteristic of the wafer;
   comparing the at least one processing characteristic of the wafer with the current state of the processing tool; and
   adjusting the operating parameter of the processing tool based on the comparison of the at least one processing characteristic of the wafer with the current state of the processing tool.

3. The method of claim 2, wherein determining at least one processing characteristic of the wafer comprises determining an effective exposure of an etch layer of the wafer.

4. The method of claim 1, wherein determining a current state of the processing tool comprises determining an etch rate processing profile of the processing tool.

5. The method of claim 1, wherein adjusting an operating parameter of the processing tool comprises decreasing a duration of an etching process.

6. The method of claim 5, wherein decreasing a duration of an etching process comprises:
   increasing an endpoint threshold concentration level;
   measuring an etch layer reaction product; and
   monitoring the measured etch layer reaction product with the increased endpoint threshold concentration level.

7. The method of claim 5, wherein decreasing a duration of an etching process comprises:
   decreasing an endpoint threshold concentration level;
   measuring a stop layer reaction product; and
   monitoring the measured stop layer reaction product with the decreased endpoint threshold concentration level.

8. The method of claim 5, wherein decreasing a duration of an etching process comprises decreasing an over etch processing time.

9. The method of claim 1, wherein adjusting an operating parameter of the processing tool comprises increasing a duration of an etching process.

10. The method of claim 9, wherein increasing a duration of an etching process comprises:
    decreasing an endpoint threshold concentration level;
    measuring an etch layer reaction product; and
    monitoring the measured etch layer reaction product with the decreased endpoint threshold concentration level.

11. The method of claim 9, wherein increasing a duration of an etching process comprises:
    increasing an endpoint threshold concentration level;
    measuring a stop layer reaction product; and
    monitoring the measured stop layer reaction product with the increased endpoint threshold concentration level.

12. The method of claim 9, wherein increasing a duration of an etching process comprises increasing an over etch processing time.

13. The method of claim 1, wherein adjusting an operating parameter of the processing tool comprises increasing an etch rate of the processing tool.

14. The method of claim 1, wherein adjusting an operating parameter of the processing tool comprises processing the wafer with the current state of the processing tool.

15. The method of claim 1, wherein determining a current state of an etch processing tool comprises:
    measuring a plurality of pre-process characteristics of a monitor wafer;
    processing the monitor wafer with the processing tool;
    measuring a plurality of post-process characteristics of the monitor wafers; and
    comparing the pre-process characteristics with the post-process characteristics of the monitor wafers.

16. The method of claim 1, wherein adjusting an operating parameter of the processing tool comprises sending and receiving data to and from an Advanced Process Controller (APC).

17. A system comprising:
- a processing tool adapted for etch processing of a wafer;
- a plurality of measuring devices for measuring a surface non-uniformity of the wafer and determining a current state of the processing tool;
- a process controller for comparing the surface non-uniformity of the wafer with the current state of the processing tool and adjusting an operating parameter of the processing tool based on the comparison.

18. The system of claim 17, wherein the process controller is adapted to receive at least one processing characteristic of the wafer, compare the at least one processing characteristic with the current state of the processing tool, and adjust the operating parameter of the processing tool based on the comparison.

19. The system of claim 17, wherein the process controller is adapted to decrease an endpoint threshold concentration level, receive a signal representing a measured etch layer reaction product, and monitor the etch layer reaction product with the decreased endpoint threshold concentration level.

20. The system of claim 17, wherein the process controller is adapted to increase an endpoint threshold concentration level, receive a signal representing a measured stop layer reaction product, and monitor the stop layer reaction product with the increased endpoint threshold concentration level.

21. The system of claim 17, wherein the process controller is adapted to process the wafer with an increased duration of an etching process.

22. The system of claim 17, wherein the process controller is adapted to process the wafer with a decreased duration of an etching process.

23. The system of claim 17, wherein the process controller is adapted to process the wafer using the current state of the processing tool.

24. The system of claim 17, wherein the process controller is an Advanced Process Controller (APC) that is coupled to an Advanced Process Control framework.

25. A computer readable program storage device encoded with instructions that, when executed by a computer, performs a method, comprising:
- measuring a surface non-uniformity of a wafer;
- determining a current state of the processing tool;
- comparing the surface non-uniformity of the wafer with the current state of the processing tool; and
- adjusting an operating parameter of the processing tool based on the comparison of the surface non-uniformity of the wafer with the current state of the processing tool.

26. The computer readable program storage device encoded with instructions that, when executed by a computer, performs the method described in claim 25, further comprising:
- determining at least one processing characteristic of the wafer;
- comparing the at least on processing characteristic of the wafer with the current state of the processing tool; and
- adjusting the operating parameter of the processing tool based on the comparison of the at least one processing characteristic of the wafer with the current state of the processing tool.

27. The computer readable storage device encoded with instructions that, when executed by a computer, performs the method described in claim 25, wherein adjusting an operating parameter of the processing tool further comprises decreasing a duration of an etching process.

28. The computer readable storage device encoded with instructions that, when executed by a computer, performs the method described in claim 25, wherein adjusting an operating parameter of the processing tool further comprises increasing a duration of an etching process.

29. The computer readable storage device encoded with instructions that when executed by a computer, performs the method described in claim 28, wherein increasing a duration of an etching process further comprises:
- decreasing an endpoint threshold concentration level;
- measuring an etch layer reaction product; and
- monitoring the measured etch layer reaction product with the decreased endpoint threshold concentration level.

30. The computer readable storage device encoded with instructions that, when executed by a computer, performs the method described in claim 28, wherein increasing a duration of an etching process further comprises:
- increasing an endpoint threshold concentration level;
- measuring a stop layer reaction product; and
- monitoring the measured stop layer reaction product with the increased endpoint threshold concentration level.

31. The computer readable storage device encoded with instructions that, when executed by a computer, performs the method described in claim 25, wherein adjusting an operating parameter of the processing tool further comprises processing the wafer with the current state of the processing tool.

32. The computer readable storage device encoded with instructions that, when executed by a computer, performs the method described in claim 25, wherein determining a current state of the processing tool further comprises:
- measuring a plurality of pre-process characteristics of a monitor wafer;
- processing the monitor wafer with the processing tool;
- measuring a plurality of post-process characteristics of the monitor wafers; and
- comparing the pre-process characteristics with the post-process characteristics of the monitor wafers.

33. A system comprising:
- means for measuring a surface non-uniformity of a wafer;
- means for determining a current state of the processing tool;
- means for comparing the surface non-uniformity of the wafer with the current state of the processing tool; and
- means for adjusting an operating parameter of the processing tool based on the comparison of the surface non-uniformity of the wafer with the current state of the processing tool.

34. The system of claim 33, further comprising:
- means for determining at least one processing characteristic of the wafer;
- means for comparing the at least on processing characteristic of the wafer with the current state of the processing tool; and
- means for adjusting the operating parameter of the processing tool based on the comparison of the at least one processing characteristic of the wafer with the current state of the processing tool.

* * * * *